(12) United States Patent
Tashiro

(10) Patent No.: US 11,367,406 B2
(45) Date of Patent: Jun. 21, 2022

(54) DRIVE CIRCUIT, LIQUID CRYSTAL DRIVE CONTROLLER, AND LIQUID CRYSTAL DISPLAY DEVICE

(71) Applicant: Trivale Technologies, Santa Clara, CA (US)

(72) Inventor: Tomohiro Tashiro, Tokyo (JP)

(73) Assignee: Trivale Technologies, Santa Clara, CA (US)

( * ) Notice: Subject to any disclaimer, the term of this patent is extended or adjusted under 35 U.S.C. 154(b) by 0 days.

(21) Appl. No.: 17/370,614

(22) Filed: Jul. 8, 2021

(65) Prior Publication Data

US 2021/0335298 A1    Oct. 28, 2021

Related U.S. Application Data

(62) Division of application No. 16/798,042, filed on Feb. 21, 2020, now Pat. No. 11,087,703.

(30) Foreign Application Priority Data

Feb. 27, 2019    (JP) .............................. JP2019-034259

(51) Int. Cl.
*G06F 1/30* (2006.01)
*G09G 3/36* (2006.01)
(Continued)

(52) U.S. Cl.
CPC ..... *G09G 3/3611* (2013.01); *G01R 19/16523* (2013.01); *G01R 19/16566* (2013.01);
(Continued)

(58) Field of Classification Search
CPC ...... G09G 3/006; G09G 3/367; G09G 3/3688; G09G 3/36; G09G 2310/0264; G09G 2320/0693; G01R 31/52; G01R 31/08; G01R 31/088; G01R 31/50; G01R 31/58; G01R 31/54; G01R 31/2635; G01R 19/16566; G01R 11/25; H05B 45/00; H05B 45/50; H05B 45/30; G06F 3/0412; G06F 1/30; G06F 1/26; G06F 11/079;
(Continued)

(56) References Cited

U.S. PATENT DOCUMENTS 4,979,066 A    12/1990 Kawata et al.
5,555,725 A    9/1996 Shimasaki et al.
(Continued)

FOREIGN PATENT DOCUMENTS

JP    H01-227611 A    9/1989
JP    H03-054489 A    3/1991
(Continued)

*Primary Examiner* — Dismery Mercedes
(74) *Attorney, Agent, or Firm* — Studebaker & Brackett PC

(57) ABSTRACT

A gate driver IC includes a first diode, a second diode, a first comparator, a second comparator, and a judgement circuit. The first comparator compares a first potential difference between both ends of the first diode and a first threshold. The second comparator compares a second potential difference between both ends of the second diode and a second threshold. Based on comparison results of the first comparator and the second comparator, the judgement circuit determines occurrence of disconnection.

8 Claims, 14 Drawing Sheets

(51) Int. Cl.
*G01R 31/50* (2020.01)
*G01R 31/52* (2020.01)
*G01R 19/165* (2006.01)
*H02H 7/122* (2006.01)
*G01R 31/08* (2020.01)
*H02H 3/32* (2006.01)
*G06F 1/26* (2006.01)
*G01R 31/54* (2020.01)
*H05B 45/50* (2022.01)
*H05B 45/30* (2020.01)
*G09G 3/00* (2006.01)

(52) U.S. Cl.
CPC ........... *G01R 31/08* (2013.01); *G01R 31/088* (2013.01); *G01R 31/52* (2020.01); *G01R 31/54* (2020.01); *G06F 1/26* (2013.01); *G06F 1/30* (2013.01); *G09G 3/36* (2013.01); *H02H 3/325* (2013.01); *H02H 7/1227* (2013.01); *H05B 45/30* (2020.01); *H05B 45/50* (2020.01); *G09G 3/006* (2013.01); *G09G 2330/04* (2013.01); *G09G 2330/12* (2013.01)

(58) Field of Classification Search
CPC ...... G06F 11/0751; H02H 3/325; H02H 3/00; H02H 7/1227
See application file for complete search history.

(56) References Cited

U.S. PATENT DOCUMENTS

| | | | |
|---|---|---|---|
| 7,157,928 B2 * | 1/2007 | So | G09G 3/006 324/760.01 |
| 7,521,904 B2 * | 4/2009 | Yoshida | H02J 7/14 322/24 |
| 8,502,812 B2 | 8/2013 | Lee et al. | |
| 9,449,552 B2 * | 9/2016 | Lee | G09G 3/3233 |
| 9,454,161 B1 | 9/2016 | Ura | |
| 9,541,981 B2 * | 1/2017 | Shirakami | G09G 3/3696 |
| 9,626,907 B2 | 4/2017 | Xie et al. | |
| 9,837,006 B2 * | 12/2017 | Hwang | G09G 3/006 |
| 10,002,060 B2 * | 6/2018 | Okita | G01R 31/52 |
| 10,365,306 B2 | 7/2019 | Yamada | |
| 10,373,539 B2 * | 8/2019 | Kim | G09G 3/006 |
| 11,217,130 B2 * | 1/2022 | Moon | H01L 27/3276 |
| 2009/0015976 A1 * | 1/2009 | Hara | B60R 16/023 361/64 |
| 2010/0271054 A1 | 10/2010 | Nagasawa | |
| 2012/0035824 A1 * | 2/2012 | Sy | G01R 31/3004 73/1.01 |
| 2014/0239714 A1 * | 8/2014 | Kurokawa | B60R 16/03 307/11 |
| 2014/0266218 A1 * | 9/2014 | Kriebernegg | H05B 45/52 324/414 |
| 2020/0098329 A1 * | 3/2020 | Kobayashi | G09G 3/3648 |

FOREIGN PATENT DOCUMENTS

| | | |
|---|---|---|
| JP | H11-087008 A | 3/1999 |
| JP | 3069196 U | 6/2000 |
| JP | 2002-041319 A | 2/2002 |
| JP | 2009-089529 A | 4/2009 |
| JP | 2010-139308 A | 6/2010 |
| JP | 2010-256064 A | 11/2010 |
| JP | 2013-173385 A | 9/2013 |

* cited by examiner

DRIVE CIRCUIT, LIQUID CRYSTAL DRIVE CONTROLLER, AND LIQUID CRYSTAL DISPLAY DEVICE

CROSS REFERENCE TO RELATED APPLICATIONS

This application is a Divisional of U.S. patent application Ser. No. 16/798,042 filed on Feb. 21, 2020, which claims benefit of priority to Japanese Patent Application No. 2019-034259 filed Feb. 27, 2019, the entire content of which is incorporated herein by reference.

BACKGROUND OF THE INVENTION

Field of the Invention

The present invention relates to a drive circuit, a liquid crystal drive controller, and a liquid crystal display device.

Description of the Background Art

In recent years, there has been an increasing demand for construction of on-board systems in consideration of ISO 26262, an automotive functional safety standard, and accordingly risk management of such on-board systems has been calling attention. For example, an abnormality in display of a liquid crystal display device (LCD) for constructing a camera monitoring system (CMS), which is expected to replace side mirrors, may more frequently cause inconvenience in driving operation. Therefore, technologies for detecting such abnormalities have been proposed (for example, Japanese Patent Application Laid-Open No. 2010-256064, Japanese Patent Application Laid-Open No. 2013-173385, and Japanese Patent Application Laid-Open No. 2010-139308).

Note that, in general, determination as to whether there is an abnormality in a drive circuit, such as a driver integrated circuit (IC) for driving liquid crystals, is made by a liquid crystal drive controller (TCON) as a timing controller, based on detection results of a feedback signal output from the drive circuit.

In the related art, whether the feedback signal has a high level or a low level is determined by a threshold (approximately 0.7 VCC, 0.3 VCC) based on an internal transistor of the timing controller IC. However, in this configuration, a value of the feedback signal varies within the range of the threshold, despite occurrence of disconnection in a power supply line and a ground line present between the drive circuit and the TCON. Thus, there has been a problem in that the abnormality cannot be detected.

SUMMARY

The present invention is made in view of the problem as described above, and has an object to provide technology that enables appropriate detection of disconnection in a power supply line or a ground line.

The present invention is intended for a drive circuit that drives liquid crystals of a liquid crystal display device. The drive circuit is connected to a liquid crystal drive controller with a power supply line and a ground line. The drive circuit includes a first diode, a second diode, a comparison unit, and a judgement circuit. The first diode includes a cathode connected to the power supply line. The second diode includes a cathode connected to an anode of the first diode, and includes an anode connected to the ground line. A predetermined signal is input to a connection point between the first diode and the second diode of the drive circuit, through a line different from the power supply line and the ground line. The comparison unit is configured to compare a first potential difference between both ends of the first diode and a first threshold, and compare a second potential difference between both ends of the second diode and a second threshold. The judgement circuit is configured to determine occurrence of disconnection in at least one of the power supply line and the ground line, based on a comparison result of the comparison unit.

Disconnection in at least one of a power supply line and a ground line can be appropriately detected.

These and other objects, features, aspects and advantages of the present invention will become more apparent from the following detailed description of the present invention when taken in conjunction with the accompanying drawings.

DESCRIPTION OF THE PREFERRED EMBODIMENTS

<Related Liquid Crystal Display Device>

Prior to the description of a liquid crystal display device according to embodiments of the present invention, a liquid crystal display device related thereto (hereinafter referred to as "related liquid crystal display device") will be described.

Figure 1:
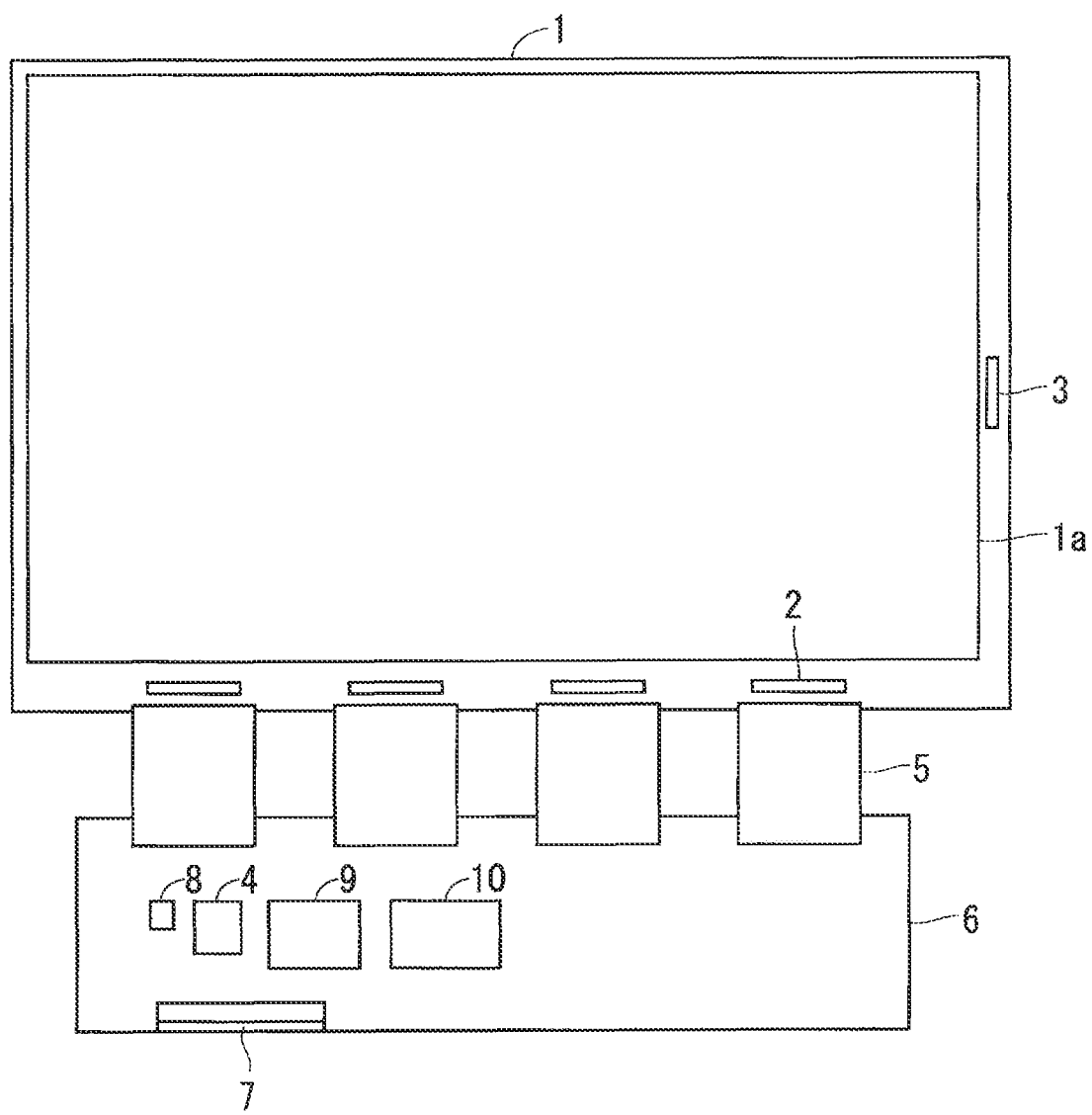
FIG. 1 is a diagram illustrating an example of an overall configuration of a related liquid crystal display device.

FIG. 1 is a diagram illustrating an overall configuration of a related liquid crystal display device. The related liquid crystal display device of FIG. 1 includes a glass substrate 1 constituting a liquid crystal panel, source driver integrated circuits (ICs) 2, gate driver ICs 3, a liquid crystal drive controller 4 (TCON 4), flexible printed circuits (FPCs) 5, a circuit board 6, an interface connector 7, an electrically erasable programmable read only memory (EEPROM) 8, a power supply circuit 9, and a gradation reference voltage generation circuit 10. Each component of the related liquid crystal display device will be described below.

In the glass substrate 1, a pixel area 1a, which is an active area where a plurality of pixels are disposed, is defined, and an alignment mark used for alignment is disposed.

The source driver ICs 2 and the gate driver ICs 3 are disposed in a frame area, which is an area outside of the pixel area 1a of the glass substrate 1, and drive liquid crystals in the pixel area 1a through wiring (not shown). Note that only one gate driver IC 3 is disposed in the frame area of in FIG. 1, but a plurality of gate driver ICs 3 may be disposed. The following description assumes that a plurality of gate driver ICs 3 are disposed.

The FPCs 5 disposed in the frame area of the glass substrate 1 are connected to the circuit board 6, in which the TCON 4, the interface connector 7, the EEPROM 8, the power supply circuit 9, and the gradation reference voltage generation circuit 10 are disposed.

Figure 2:
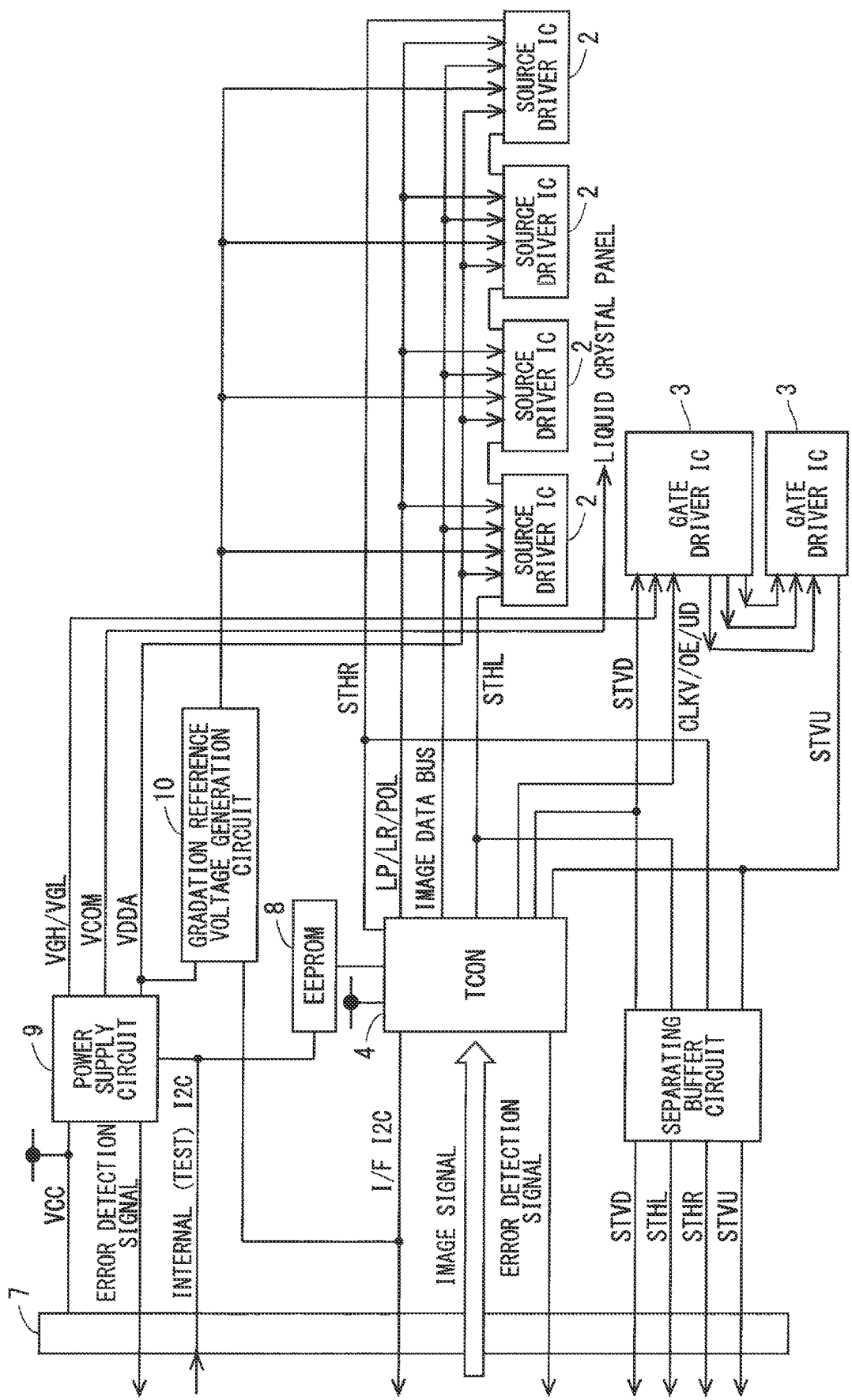
FIG. 2 is a diagram illustrating an example of a connection relationship between circuit blocks of the related liquid crystal display device.
Figure 3:
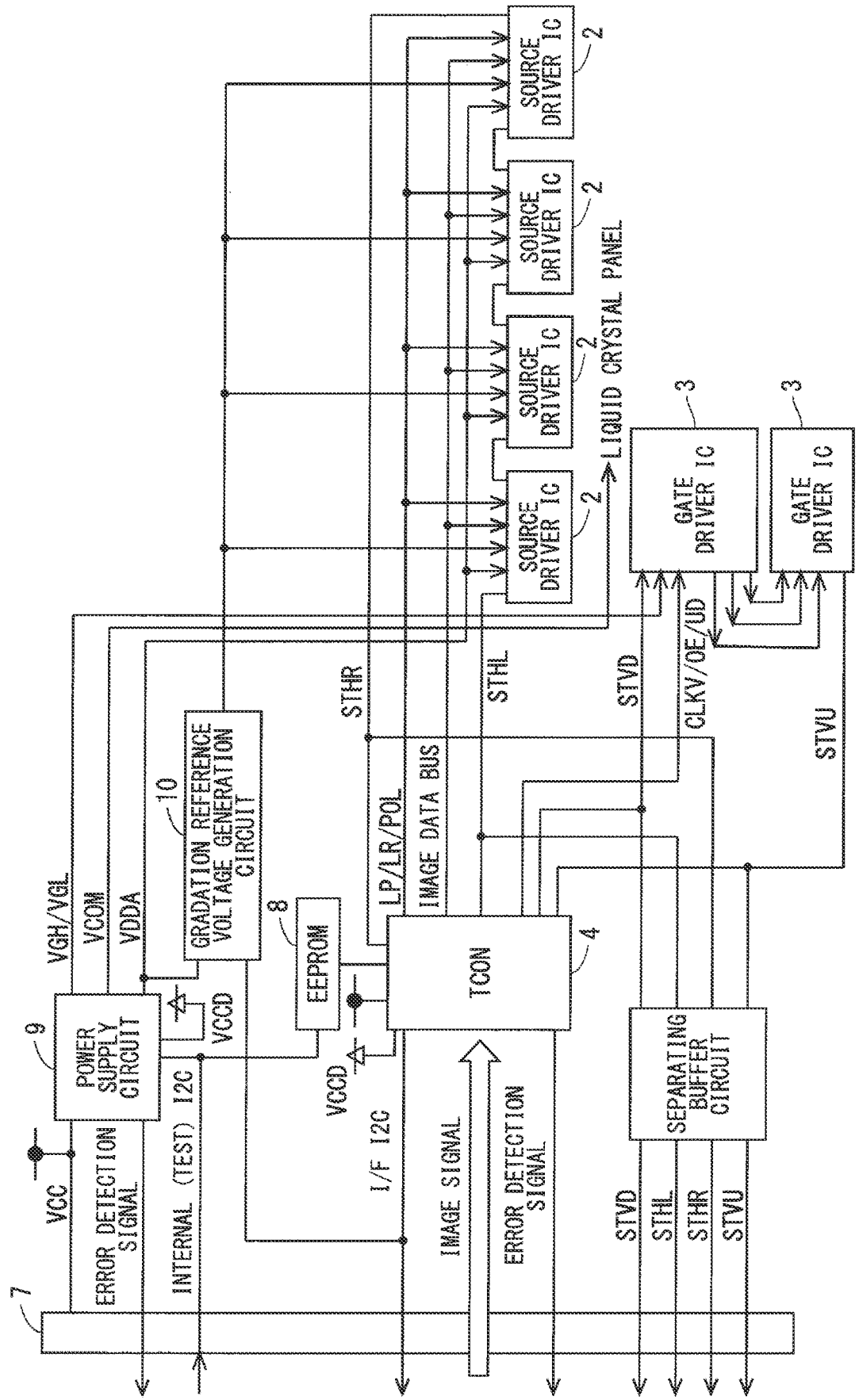
FIG. 3 is a diagram illustrating an example of a connection relationship between circuit blocks of the related liquid crystal display device.
Figure 4:
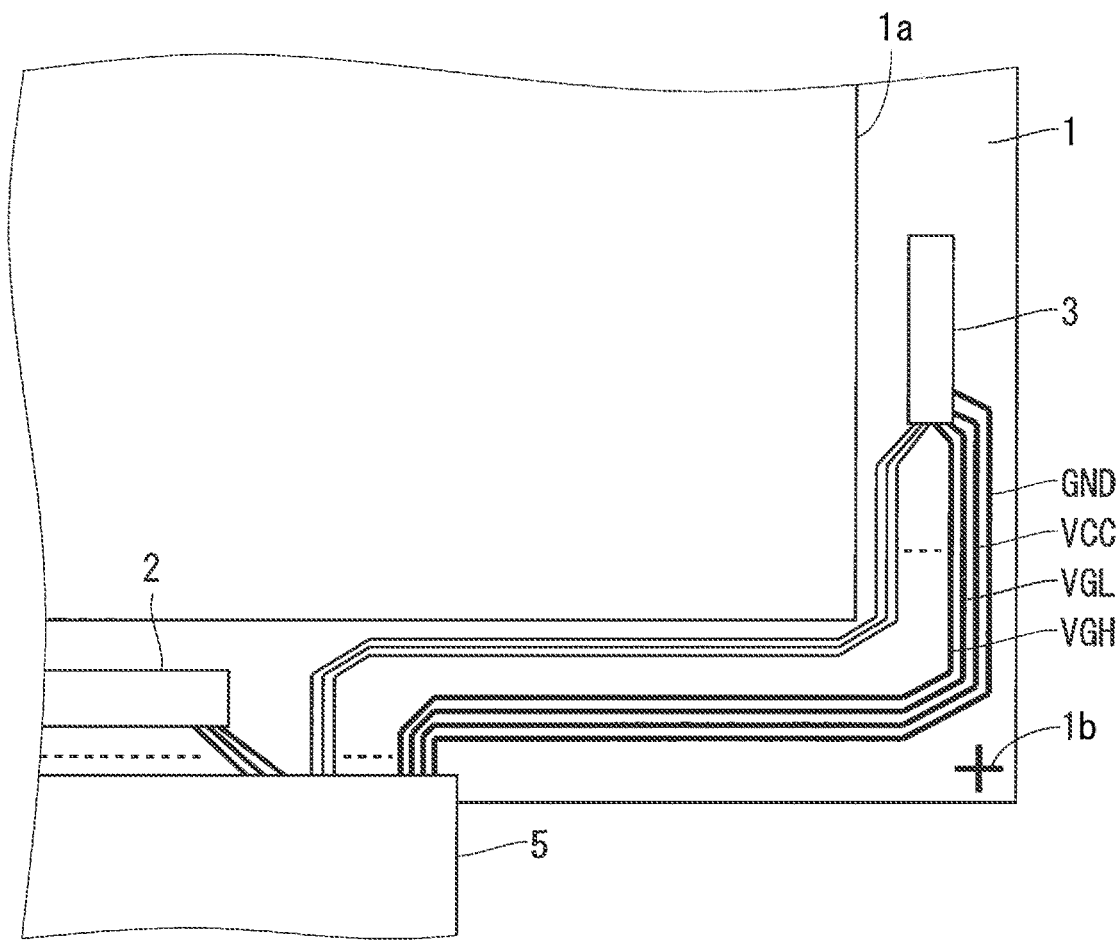
FIG. 4 is a diagram illustrating an example of wiring from an FPC to a gate driver IC in the related liquid crystal display device.

FIG. 2 is a diagram illustrating an example of a connection relationship between the circuit blocks of the related liquid crystal display device. FIG. 3 is a diagram illustrating another example of a connection relationship between the circuit blocks of the related liquid crystal display device, which is the same as FIG. 2 except that each of the TCON 4 and the power supply circuit 9 is connected to VCCD in FIG. 3. Further, although not shown, a configuration that omits VCC in the power supply for the TCON 4, e.g., a configuration in which power supply is not directly received from input VCC if VCC is 5 V and VCCD is +3.3 V, is also included. FIG. 4 is a diagram illustrating an example of wiring from one FPCs 5 to one gate driver IC 3 in the related liquid crystal display device.

The power supply circuit 9 of FIG. 2 generates a power supply voltage to be used in various circuits, based on a voltage received in the interface connector 7. The gradation reference voltage generation circuit 10 generates a gradation reference voltage to be used in the source driver ICs 2, which will then be used for liquid crystals.

The TCON 4 illustrated in FIG. 2 and FIG. 4 controls the source driver ICs 2 and the gate driver ICs 3, through the FPCs 5 and a plurality of wires. For example, the plurality of wires connected between the TCON 4 and each gate driver IC 3 include various wires used for transmission of an OE signal, a CLKV signal, an STVD signal, an STVU signal, and a UD signal, a power supply line VCC, and a ground line GND. VGH represents a power supply for turning on TFTs and pixels in the pixel area 1a, and VGL represents a power supply for turning off TFTs and pixels in the pixel area 1a. For example, a voltage of VGH is 25 V. For example, a voltage of VGL is −7 V.

According to the logic of the UD signal illustrated in FIG. 2 and FIG. 3, one of the STVU signal and the STVD signal corresponds to an input to a gate driver IC 3 that is disposed in the first stage in a scanning direction, and the other signal corresponds to an output from a gate driver IC 3 that is disposed in the last stage in the scanning direction. According to the UD scanning logic, a start pulse STVout signal, which is output from the gate driver IC 3 disposed in the last stage to the TCON 4, corresponds to either the STVU signal or the STVD signal.

Figure 5:
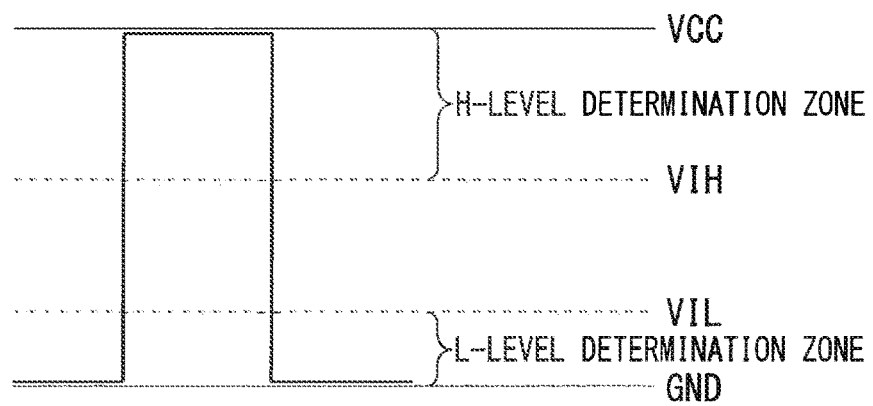
FIG. 5 is a diagram illustrating an example of a signal waveform and a relationship between VIH and VIL, at the time of normal operation of the related liquid crystal display device.

FIG. 5 is a diagram illustrating a waveform of the STVout signal at the time of normal operation. A minimum value VIH for the high level of the STVout signal enabling normal operation of the liquid crystal display device and a maximum value VIL for the low level of the STVout signal enabling normal operation of the liquid crystal display device are defined for the STVout signal. For example, the minimum value VIH is a minimum value for the high level of the STVout signal enabling normal operation of the gate driver ICs 3. In a similar manner, for example, the maximum value VIL is a maximum value for the low level of the STV signal enabling normal operation of the gate driver ICs 3.

In this case, if the high level of the STVout signal is lower than the minimum value VIH, the TCON 4 according to the related liquid crystal display device detects occurrence of disconnection in the power supply line VCC. If the low level of the STVout signal is higher than the maximum value VIL, the TCON 4 detects occurrence of disconnection in the ground line GND.

Figure 6:
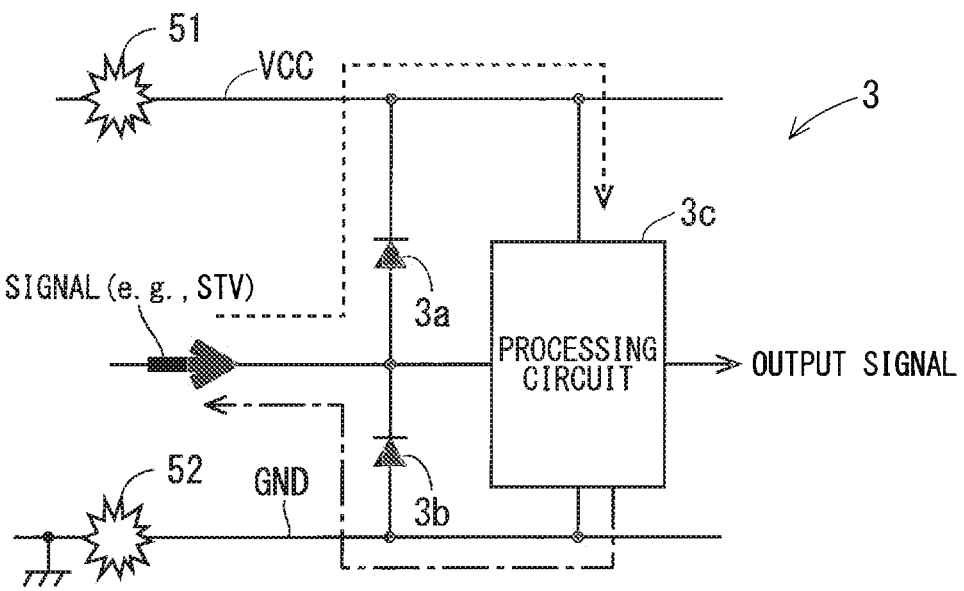
FIG. 6 is a diagram illustrating an example of power supply from a signal line, when power supplies of VCC and GND are disconnected in the related liquid crystal display device.

FIG. 6 is a diagram illustrating a configuration of one gate driver IC 3 of the related liquid crystal display device. The gate driver IC 3 of FIG. 6 includes a plurality of I/O terminals. In each of the plurality of I/O terminals, the gate driver IC 3 further includes a first diode 3a, a second diode 3b, and a processing circuit 3c.

The first diode 3a and the second diode 3b are each an ESD protection diode provided in an I/O unit of the gate driver IC 3. One I/O terminal includes one set of the first diode 3a and the second diode 3b. The cathode of the first diode 3a is connected to the power supply line VCC. The cathode of the second diode 3b is connected to the anode of the first diode 3a. A signal input wire is connected to the anode of the first diode 3a and the cathode of the second diode 3b. The anode of the second diode 3b is connected to the ground line GND.

Using power of the power supply line VCC, the processing circuit 3c performs signal processing, and outputs an output signal to a gate driver IC 3 disposed in a subsequent stage or to the TCON 4, for example.

In this case, as illustrated in FIG. 4, if the gate drivers IC 3 are Chip On Glass (COG) ICs and the gate driver ICs 3 consume a small amount of electric currents, only a single system of wiring may be provided between the gate drivers IC 3 and the TCON 4 due to restriction of the frame area. Moreover, an STVout signal from a gate driver IC 3 may be used as an STV signal of a gate driver IC 3 disposed in a subsequent stage, so as to be input to the gate driver IC 3 disposed in the subsequent stage. Therefore, such a configuration that only a single system of wiring is provided in the related liquid crystal display device has a problem in that occurrence of disconnection in the power supply line VCC and the ground line GND cannot be appropriately detected. This will be described below in detail.

As an example, when disconnection 51 occurs in the power supply line VCC, the processing circuit 3c of the gate driver IC 3 is not supplied with power from the power supply line VCC. However, as denoted by the dotted arrow of FIG. 6, power supply is supplied to the processing circuit 3c, through the signal input wire and the first diode 3a. Although not shown, the gate driver IC 3 includes a plurality of signal input wires, and can therefore be supplied with an adequate voltage and electric current for enabling operation of the processing circuit 3c, as long as the gate driver IC 3 receives an input of a high-level signal during normal use and a high-level signal in most of the times from the TCON 4.

In contrast, when disconnection 52 occurs in the ground line GND, an electric current of the processing circuit 3c of the gate driver IC 3 cannot flow any further. However, as denoted by the one-dot-one-dash arrow of FIG. 6, the electric current can flow out to the ground line GND of the circuit board 6, through the second diode 3b and the signal input wire. Although not shown, the gate driver IC 3 includes a plurality of signal input wires, and can therefore feed the electric current of the processing circuit 3c back to the circuit board 6, as long as the gate driver IC 3 receives an input of a low-level signal during normal use and a low-level signal in most of the times from the TCON 4.

In this case, if the gate driver ICs 3 consume a large amount of electric currents, electric current supply to the processing circuit 3c from the TCON 4 through a signal line, or electric current feedback from the processing circuit 3c becomes inadequate, which inhibits operation of the gate driver IC 3. This prevents normal input of the STVout signal into the TCON 4, making it possible to immediately detect startup failure, display failure, etc. If the gate driver ICs 3 consume a small amount of electric currents, however, a pseudo-normal STVout signal, though being abnormal in actuality, is supplied to the processing circuit 3c, which may in some cases inhibit detection of failures as described above.

Figure 7:
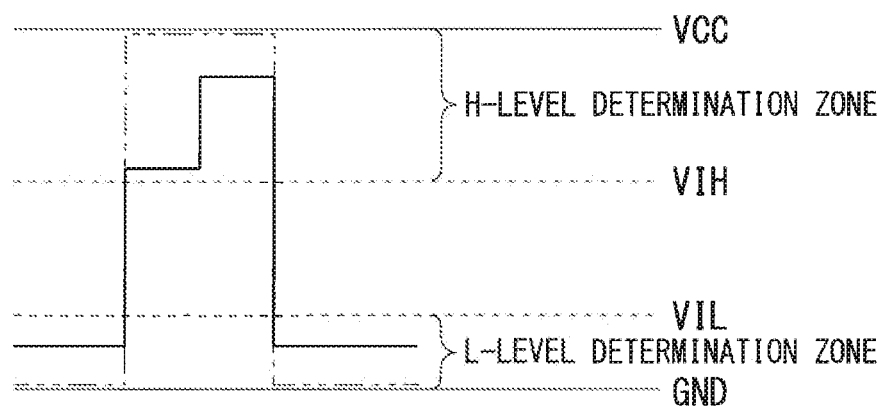
FIG. 7 is a diagram illustrating an example of a signal waveform and a relationship between VIH and VIL, when disconnection occurs in a power supply and GND in the related liquid crystal display device.

FIG. 7 is a diagram illustrating a waveform of the STVout signal when disconnection occurs in the power supply line VCC and the ground line GND, in a configuration that the gate driver ICs 3 consume a small amount of electric currents. The high level of the STVout signal when disconnection occurs in the power supply line VCC is shifted lower than the level when disconnection does not occur (two-dot-one-dash line of FIG. 7). In contrast, the low level of the STVout signal when disconnection occurs in the ground line GND is shifted higher than the level when disconnection does not occur in the ground line GND (two-dot-one-dash line of FIG. 7).

In the state of FIG. 7, however, the high level of the STVout signal does not fall below the minimum value VIH for detecting disconnection, and the low level of the STVout signal does not exceed the maximum value VIL for detecting disconnection. In this state, the liquid crystal display device, though not in a normal state, may continue to normally operate after all. In this case, the operation can easily turn into abnormal operation depending on a load condition of the line, and thus device operation cannot be secured by any means.

For example, a slight change in a load on the STVout signal line may stop normal operation of the gate driver ICs 3, and may sometimes change a mode to a dual frame drive mode to activate one-side polarity drive, causing "image sticking" on the liquid crystal panel. This may cause inconvenience of preventing the related liquid crystal display device from achieving safety goals specified in ISO 26262, which has hitherto been posing a problem. In comparison to the related art, a liquid crystal display device according to embodiments of the present invention described below can appropriately detect disconnection in the power supply line VCC and the ground line GND.

First Embodiment

An overall configuration of a liquid crystal display device according to a first embodiment of the present invention is substantially the same as the overall configuration of the related liquid crystal display device of FIG. 1. Of the components according to the first embodiment, components that are the same as or similar to the above-described components are hereinafter denoted by the same reference signs, and different components will be mainly described.

Figure 8:
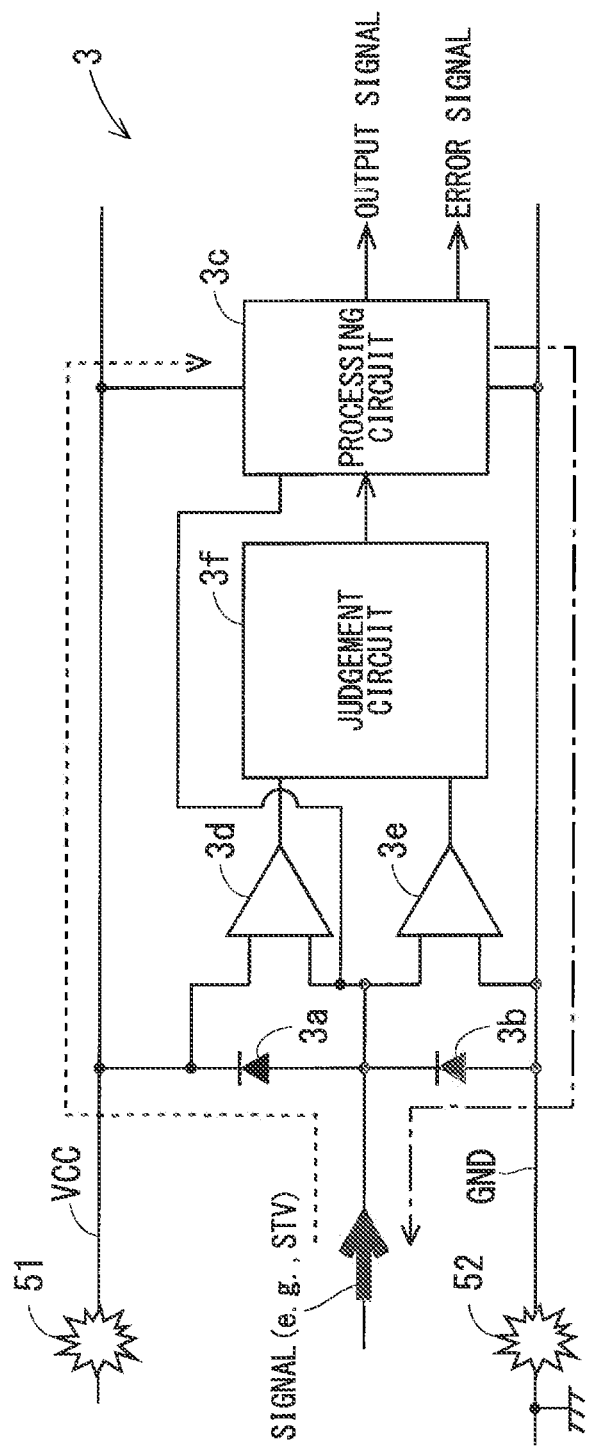
FIG. 8 is a diagram illustrating a configuration of a gate driver IC of a liquid crystal display device according to a first embodiment.

FIG. 8 is a diagram illustrating a configuration of one gate driver IC 3 according to the first embodiment. The configuration of the gate driver IC 3 of FIG. 8 is the same as the configuration of the gate driver IC 3 of FIG. 6, except that a first comparator 3d, a second comparator 3e, and a judgement circuit (determination circuit) 3f are added. Note that the description herein assumes that a predetermined signal to be input to a connection point between the first comparator 3d and the second comparator 3e is the STV signal, but this is not restrictive.

When VCC disconnection (power supply disconnection caused due to disconnection in the power supply line VCC on the glass substrate 1 or on the FPCs 5) occurs, an electric current that does not flow in a case of normal operation, i.e., a case other than VCC disconnection, flows through the first diode 3a. Owing to the electric current, both ends of the first diode 3a generate a potential difference that corresponds to a forward drop voltage Vf of the first diode 3a. Note that, for example, the forward drop voltage Vf is approximately 0.6 V, when an Si diode or an Si transistor connected to a diode is used.

In a similar manner, when GND disconnection occurs, an electric current that does not flow in a case of normal operation, i.e., a case other than GND disconnection, flows through the second diode 3b. Owing to the electric current, both ends of the second diode 3b generate a potential difference that corresponds to a forward drop voltage Vf of the second diode 3b.

In light of this, the first comparator 3d compares a first potential difference between both the ends of the first diode 3a and a first threshold. When the first potential difference is equal to or higher than the first threshold, the first comparator 3d outputs a high-level signal to the judgement circuit 3f. Further, the second comparator 3e compares a second potential difference between both the ends of the second diode 3b and a second threshold. When the second potential difference is equal to or higher than the second threshold, the second comparator 3e outputs a high-level signal to the judgement circuit 3f. Note that the first threshold and the second threshold each correspond to the above forward drop voltage Vf. The first threshold and the second threshold may be the same as or different from each other.

A comparison unit including the first comparator 3d and the second comparator 3e as described above compares the first potential difference between both the ends of the first diode 3a and the first threshold, and compares the second potential difference between both the ends of the second diode 3b and the second threshold.

Based on comparison results of the first comparator 3d and the second comparator 3e, the judgement circuit 3f determines occurrence of disconnection in at least one of the power supply line VCC and the ground line GND. For example, when the judgement circuit 3f receives a high-level signal from the first comparator 3d, the judgement circuit 3f determines that disconnection occurs in the power supply line VCC. For example, when the judgement circuit 3f receives a high-level signal from the second comparator 3e, the judgement circuit 3f determines that disconnection occurs in the ground line GND.

Determination results of the judgement circuit 3f are input to the processing circuit 3c, and the processing circuit 3c outputs the determination results to the TCON 4 of the liquid crystal display device, or to an external circuit such as a system microprocessor through an I/F, for example. Note that, although the judgement circuit 3f is provided separately from the processing circuit 3c in FIG. 8, the judgement circuit 3f may be provided inside the processing circuit 3c.

Overview of First Embodiment

The gate driver ICs 3 and the liquid crystal display device according to the first embodiment as described above compare the first potential difference between both the ends of the first diode 3a with the first threshold, and compare the second potential difference between both the ends of the second diode 3b with the second threshold. According to such a configuration, thresholds used for determining disconnection in the power supply line VCC and the ground line GND are shifted in such a manner that disconnection determination is made more strictly. As a result, such disconnection can be appropriately detected.

Second Embodiment

Figure 9:
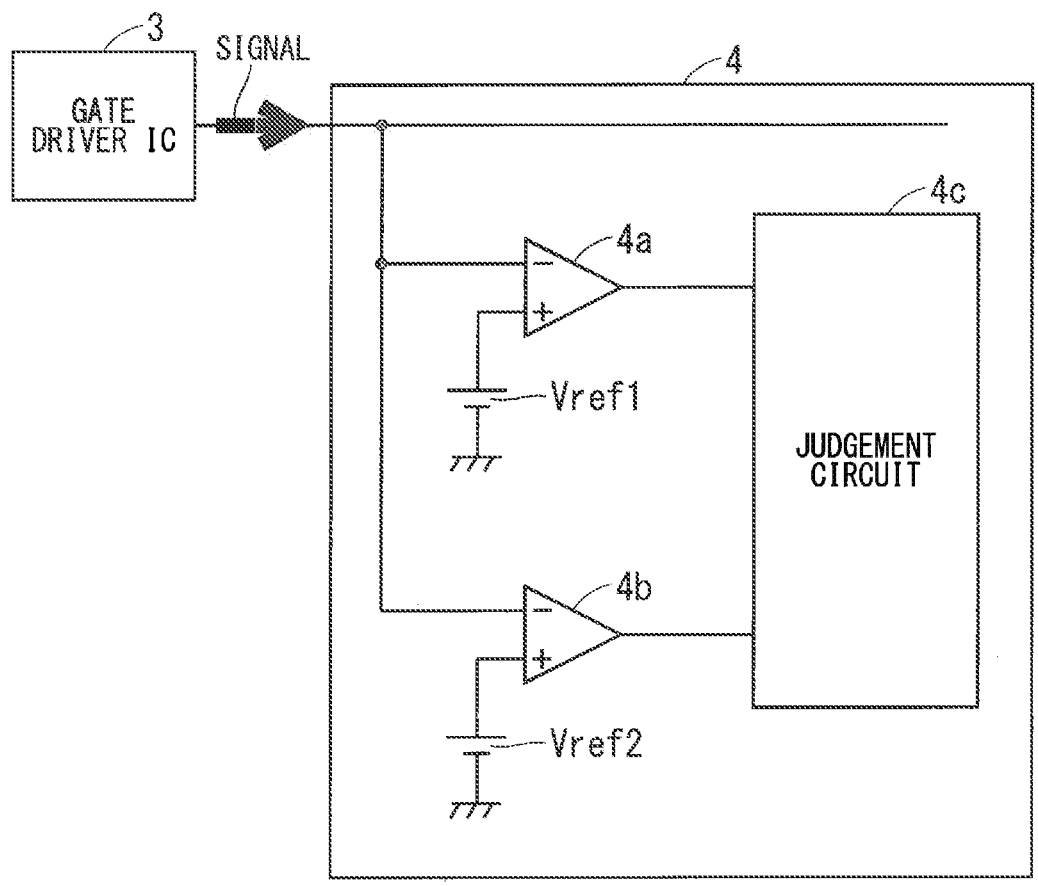
FIG. 9 is a diagram illustrating a configuration of a TCON of the liquid crystal display device according to a second embodiment.

FIG. 9 is a diagram illustrating a configuration of the TCON 4 according to a second embodiment of the present invention. Of the components according to the second embodiment, components that are the same as or similar to the above-described components are hereinafter denoted by the same reference signs, and different components will be mainly described.

In the second embodiment, as in the case of the related liquid crystal display device, the STVout signal is input from the gate driver IC 3 to the TCON 4 of FIG. 9. The following description assumes that a signal reflecting disconnection in at least one of the power supply line VCC and the ground line GND is the STVout signal, but this is not restrictive. The TCON 4 of FIG. 9 includes a first comparator 4a, a first power supply Vref1, a second comparator 4b, a second power supply Vref2, and a judgement circuit 4c.

The first comparator 4a is a comparator that compares the high level of the STVout signal with a minimum threshold VIH1, which is higher than the minimum value VIH set in the first power supply Vref1. Note that, for example, a voltage approximately 0.3 to 0.6 V lower than VCC is used as the minimum threshold VIH1.

The second comparator 4b is a comparator that compares the low level of the STVout signal with a maximum threshold VIL1, which is lower than the maximum value VIL set in the second power supply Vref2. Note that, for example, a voltage approximately 0.3 to 0.6 V higher than GND is used as the maximum threshold VIL1.

A comparison unit including the first comparator 4a and the second comparator 4b as described above compares the high level of the STVout signal with the minimum threshold VIH1, and compares the low level of the STVout signal with the maximum threshold VIL1.

Based on comparison results of the first comparator 4a and the second comparator 4b, the judgement circuit 4c determines occurrence of disconnection in at least one of the power supply line VCC and the ground line GND. For example, if the first comparator 4a produces a comparison result that the high level of the STVout signal is lower than the minimum threshold VIH1, the judgement circuit 4c determines that disconnection occurs in the power supply line VCC. For example, if the second comparator 4b produces a comparison result that the low level of the STVout signal is higher than the maximum threshold VIL1, the judgement circuit 4c determines that disconnection occurs in the ground line GND. Determination results of the judgement circuit 4c are output to an external circuit such as a system microprocessor through an I/F, for example.

Overview of Second Embodiment

Figure 10:
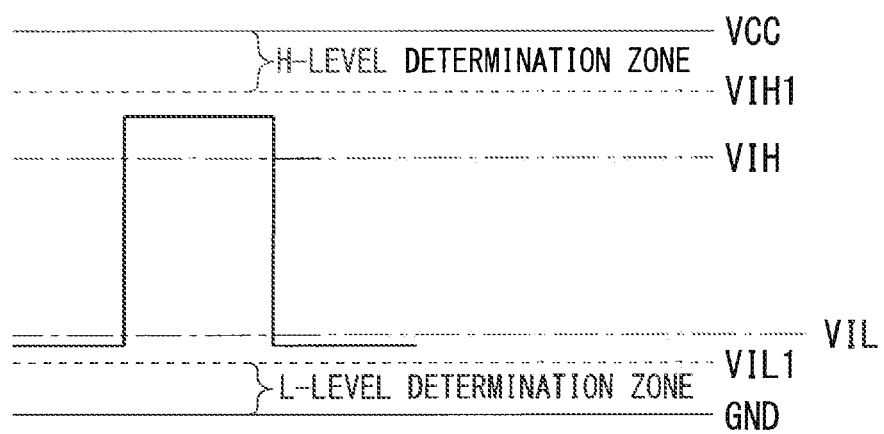
FIG. 10 is a diagram illustrating an example of a signal waveform and a relationship between VIH, VIL, VIH1, and VIL1, when disconnection occurs in a power supply and GND in the liquid crystal display device according to the second embodiment.

The TCON 4 and the liquid crystal display device according to the second embodiment as described above compare the high level of the STVout signal with the minimum threshold VIH1, and compare the low level of the STVout signal with the maximum threshold VIL1. According to such a configuration, as illustrated in FIG. 10, thresholds used for determining disconnection in the power supply line VCC and the ground line GND are shifted in such a manner that disconnection determination is made more strictly. As a result, such disconnection can be appropriately detected.

Third Embodiment

Figure 11:
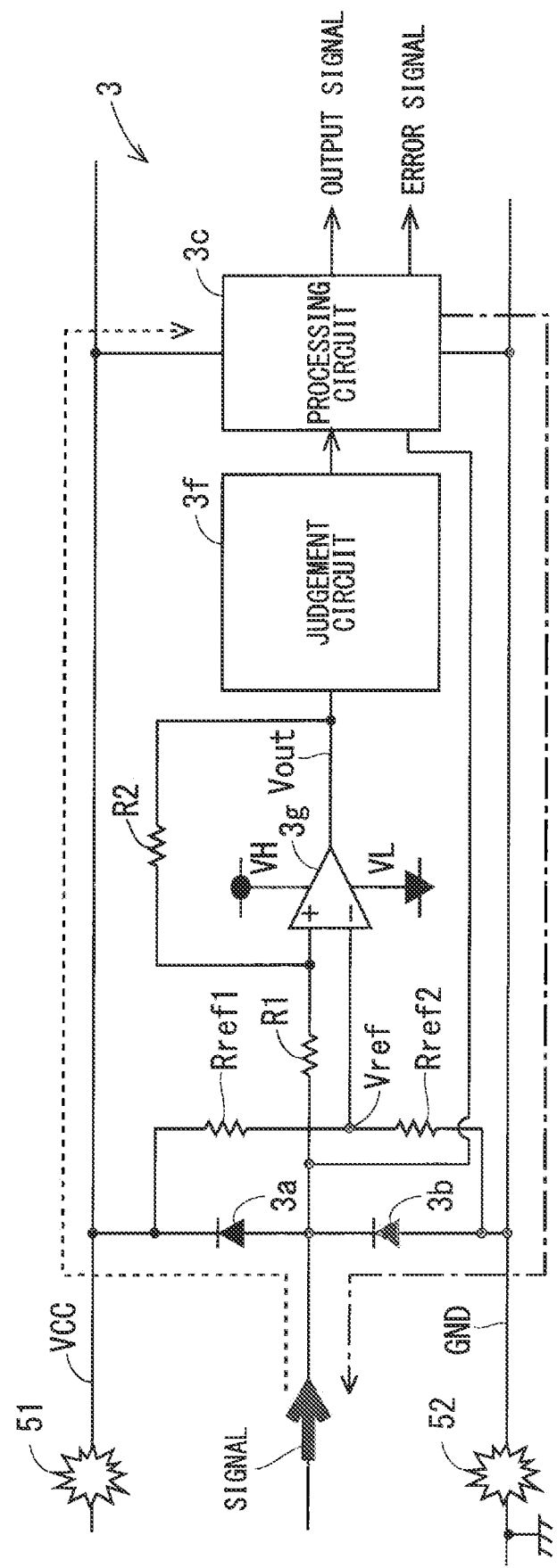
FIG. 11 is a diagram illustrating a configuration of a gate driver IC of the liquid crystal display device according to a third embodiment.

FIG. 11 is a diagram illustrating a configuration of one gate driver IC 3 according to a third embodiment of the present invention. Of the components according to the third embodiment, components that are the same as or similar to the above-described components are hereinafter denoted by the same reference signs, and different components will be mainly described.

A configuration of the gate driver IC 3 of FIG. 11 is the same as that of FIG. 8, except that the first comparator 3d and the second comparator 3e of FIG. 8 are replaced by resistors Rref1, Rref2, R1, and R2s and a third comparator 3g. Specifically, although the gate driver IC 3 of FIG. 6 uses two comparators, the gate driver IC 3 of FIG. 11 uses one comparator.

A connection point between the first diode 3a and the second diode 3b is connected to a non-inverting input of the third comparator 3g, through the resistor R1. An output (Vout) of the third comparator 3g is connected to the non-inverting input of the third comparator 3g, through the resistor R2. Both ends of a series connection element consisting of the first diode 3a and the second diode 3b are connected to both ends of a series connection element consisting of the resistor Rref1 and the resistor Rref2. A connection point (corresponding to a reference voltage Vref) between the resistor Rref1 and the resistor Rref2 is connected to an inverting input of the third comparator 3g. Note that power supplies VH and VL are used as the power supply for the third comparator 3g.

According to such a configuration, the third comparator 3g is a hysteresis comparator that respectively compares the first potential difference and the second potential difference with the first threshold and the second threshold, based on the sum of the first potential difference and the second potential difference, and a voltage at the connection point between the first diode 3a and the second diode 3b.

Figure 12:
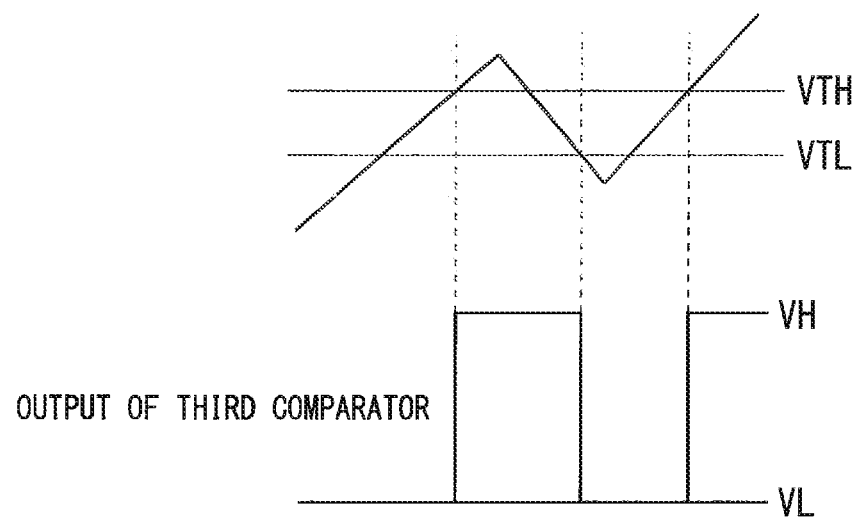
FIG. 12 is a diagram illustrating a comparator positive-side input waveform and its output waveform of the liquid crystal display device according to the third embodiment.

FIG. 12 is a diagram illustrating operation of the third comparator 3g according to the third embodiment. Even when the positive-side input of the third comparator 3g reaches VTL, the output of the third comparator 3g is kept at the low level until the input reaches VTH. In contrast, even when the positive-side input of the third comparator 3g reaches VTH, the output of the third comparator 3g is kept at the high level until the input reaches VTL. If a configuration of VIH1=VTH and VIL1=VTL is adopted, the following occurs. Specifically, the positive-side input of the third comparator 3g does not exceed VTH at the time of VCC disconnection, and hence the output of the third comparator 3g does not reach the high level, while the positive-side input of the third comparator 3g does not fall below VTL at the time of GND disconnection, and hence the output of the third comparator 3g does not reach the low level. The use of a signal that alternately includes the high level and the low level, such as the STV signal, enables detection of disconnection. Specific formulas (1) to (4) for the minimum threshold VTH and the maximum threshold VTL are given below.

[Formula 1]

$$V\text{ref} = R\text{ref2}/(R\text{ref1} + R\text{ref2}) \times VCC \quad (1)$$

[Formula 2]

$$V\text{out} = VH - VL \quad (2)$$

[Formula 3]

$$VTH = (1 + R1/R2) \times V\text{ref} - R1/R2 \times VL \quad (3)$$

[Formula 4]

$$VTL = (1 + R1/R2) \times V\text{ref} - R1/R2 \times VH \quad (4)$$

For example, applying values of Rref1=50 kΩ, Rref2=60 kΩ, R1=50 kΩ, and R2=100 kΩ to a configuration of VCC=3.3 V, VH=4.5 V, VL=−0.3 V, and Vout=4.8 V brings VTH to 2.85 V and VTL to 0.3 V. Such application can make the minimum threshold VIH1 higher than the minimum value VIH, and the maximum threshold VIL1 lower than the maximum value VIL. As can be understood from the above formulas, the minimum threshold VTH and the maximum threshold VTL of the hysteresis comparator of FIG. 12 are adjustable with values of the resistors and values of the power supplies VH and VL of the third comparator 3g. Therefore, making free changes to voltages of the power supplies VH and VL of the third comparator 3g can set the minimum threshold VTH and the maximum threshold VTL to desired values.

Figure 13:
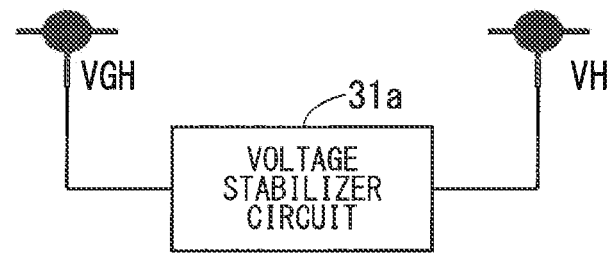
FIG. 13 is a diagram illustrating an example of a circuit for changing a voltage from VGH to VH of the liquid crystal display device according to the third embodiment.
Figure 14:
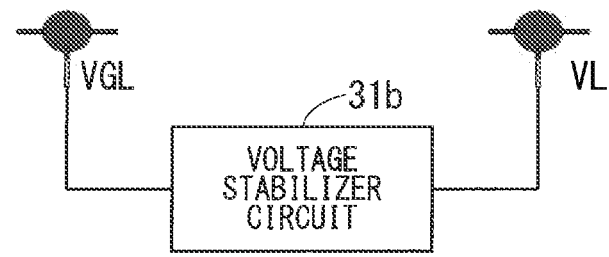
FIG. 14 is a diagram illustrating an example of a circuit for changing a voltage from VGL to VL of the liquid crystal display device according to the third embodiment.

Note that the voltages of the power supplies VH and VL of the third comparator 3g may be different from the voltage of the power supply line VCC. For example, as illustrated in FIG. 13, the voltage of the power supply VH of the third comparator 3g may be generated by adjusting the voltage of the power supply VGH of the gate driver IC 3 with the use of a voltage stabilizer circuit 31a including a voltage adjustment circuit. Alternatively, for example, as illustrated in FIG. 14, the voltage of the power supply VL of the third comparator 3g may be generated by adjusting the voltage of the power supply VGL of the gate driver IC 3 with the use of a voltage stabilizer circuit 31b including a voltage adjustment circuit. According to such a configuration, because the power supplies VGH and VGL of the third comparator 3g are independent of the lines, the third comparator 3g can continue to operate in a normal state to the extent possible, even if there is abnormality in the power supply line VCC and the ground line GND.

Figure 15:
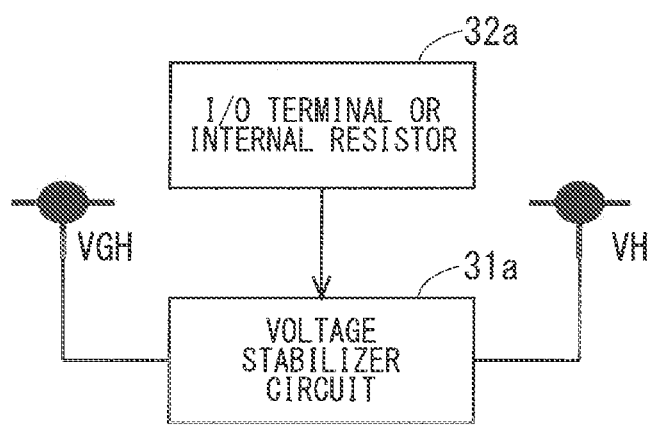
FIG. 15 is a diagram illustrating an example of a circuit enabling adjustment of a voltage with an I/O terminal or an internal resistor of the liquid crystal display device according to the third embodiment.
Figure 16:
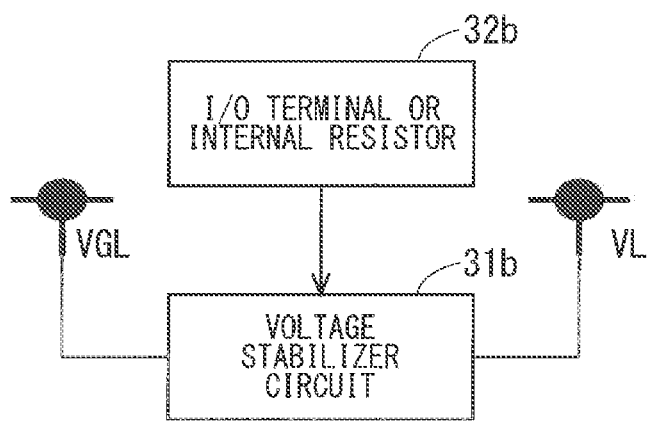
FIG. 16 is a diagram illustrating an example of a circuit enabling adjustment of a voltage with an I/O terminal or an internal resistor of the liquid crystal display device according to the third embodiment.

Alternatively, for example, as illustrated in FIG. 15 and FIG. 16, the voltages of the power supplies VH and VL may be adjusted from the outside by connecting I/O terminals or internal resistors 32a and 32b respectively to the voltage stabilizer circuits 31a and 31b. Such a configuration makes it easier to adjust the minimum threshold VTH and the maximum threshold VTL, and even the minimum threshold VIH1 and the maximum threshold VIL1, for each individual product, and is therefore efficient.

Based on a comparison result of the third comparator 3g, the judgement circuit 3f of FIG. 11 determines occurrence of disconnection in at least one of the power supply line VCC and the ground line GND. For example, if the output of the third comparator 3g does not switch from a relatively high output to a relatively low output within a certain period of time, or vice versa, the judgement circuit 3f determines that disconnection occurs in at least one of the power supply line VCC and the ground line GND.

Overview of Third Embodiment

The gate driver ICs 3 and the liquid crystal display device according to the third embodiment can produce effects similar to those of the first embodiment, with the use of one comparator.

Fourth Embodiment

Figure 17:
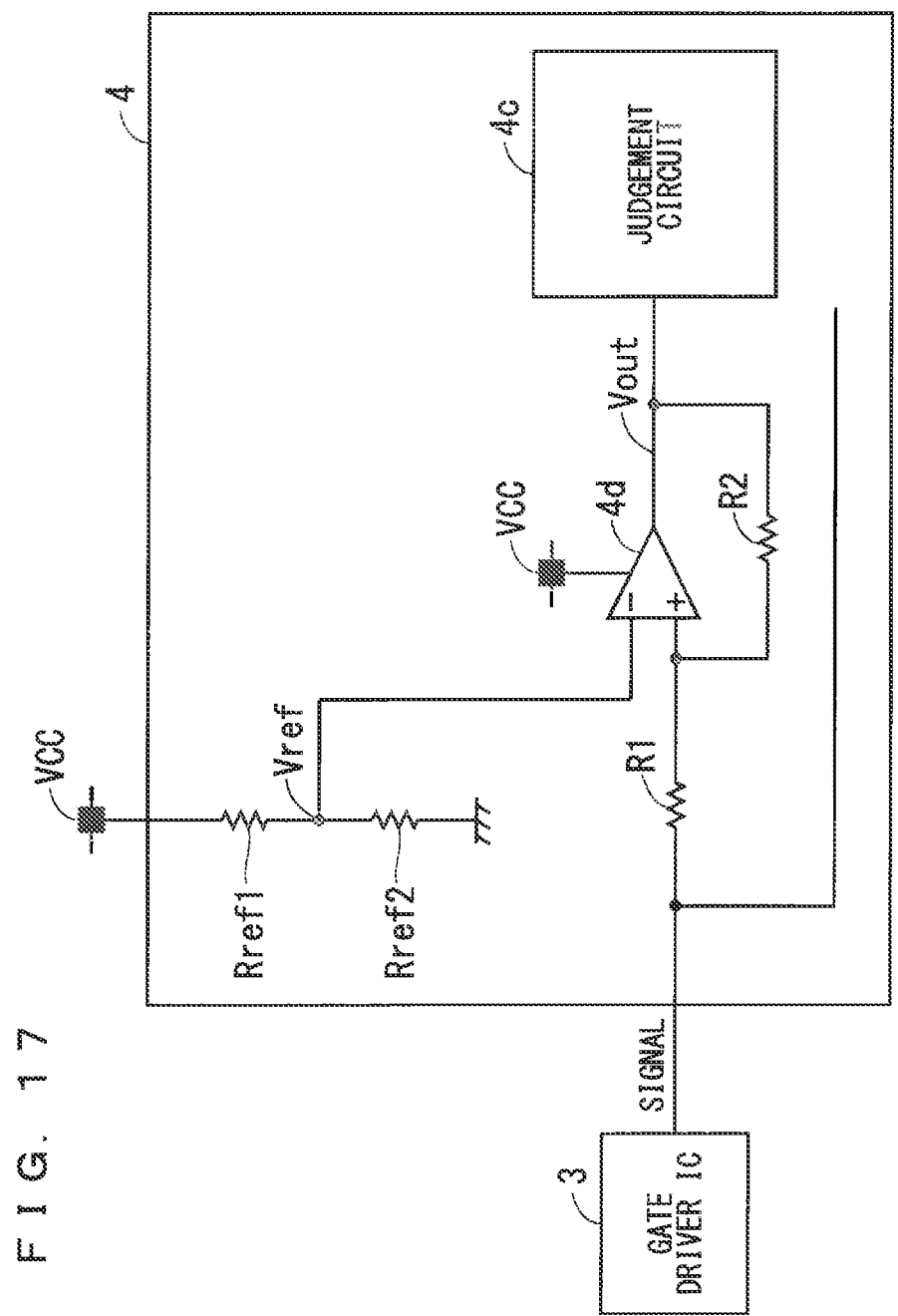
FIG. 17 is a diagram illustrating a configuration of a TCON of the liquid crystal display device according to a fourth embodiment.

FIG. 17 is a diagram illustrating a configuration of the TCON 4 according to a fourth embodiment of the present invention. Of the components according to the fourth embodiment, components that are the same as or similar to the above-described components are hereinafter denoted by the same reference signs, and different components will be mainly described.

The configuration of the TCON 4 of FIG. 17 is the same as that of FIG. 9, except that the first comparator 4a and the second comparator 4b of FIG. 9 are replaced by resistors Rref1, Rref2, R1, and R2 and a third comparator 4d. Specifically, although the TCON 4 of FIG. 10 uses two comparators, the TCON 4 of FIG. 17 uses one comparator.

The gate driver IC 3 is connected to the non-inverting input of the third comparator 4d, through the resistor R1. An output (Vout) of the third comparator 4d is connected to the non-inverting input of the third comparator 4d, through the resistor R2. The voltage of the power supply VCC is divided by the resistor Rref1 and the resistor Rref2. The divided voltage is connected to the inverting input of the third comparator 4d as a reference voltage Vref. In the fourth embodiment, the power supply VCC is a connection power supply, which is a power supply connected to the TCON 4, and is used for supplying power to the third comparator 4d.

According to such a configuration, the third comparator 4d is a comparator similar to the third comparator 3g of the third embodiment. Specifically, the third comparator 4d is a hysteresis comparator that respectively compares the high level and the low level of the STVout signal with the minimum threshold and the maximum threshold, based on the voltage of the power supply VCC and the STVout signal. Note that, in a similar manner to the third embodiment, the minimum threshold and the maximum threshold are adjustable with values of the resistors and values of the power supply of the third comparator 4d.

Based on a comparison result of the third comparator 4d, the judgement circuit 4c determines occurrence of disconnection in at least one of the power supply line VCC and the ground line GND. For example, if the output of the third comparator 4d does not switch from a relatively high output to a relatively low output within a certain period of time, or vice versa, the judgement circuit 4c determines that disconnection occurs in at least one of the power supply line VCC and the ground line GND.

Incidentally, if a configuration of VL=0 V and VH=Vout=VCC is adopted in the above formulas (1) to (4), the following occurs. Specifically, the minimum threshold VTH and the maximum threshold VTL of FIG. 12, and even the minimum threshold VIH1 and the maximum threshold VIL1 of FIG. 9, which are determined by the values of the resistors, do not respectively have a value larger than the minimum value VIH and a value smaller than the maximum value VIL.

In light of this, it is preferable to adopt a configuration satisfying VCC Vout, i.e., a configuration in which the voltage of the power supply of the third comparator 4d differs from the voltage of the power supply line VCC. Such a configuration enhances freedom in design, and enables detection of disconnection in the power supply line VCC and the ground line GND.

For example, applying values of Rref1=50 kΩ, Rref2=60 kΩ, R1=50 kΩ, and R2=100 kΩ to a configuration of VCC=3.3 V, VL=0 V, and VH=Vout=4.5 V brings VTH to 2.7 V and VTL to 0.45 V. Such application can make the minimum threshold VIH1 higher than the minimum value VIH, and the maximum threshold VIL1 lower than the maximum value VIL.

Figure 18:
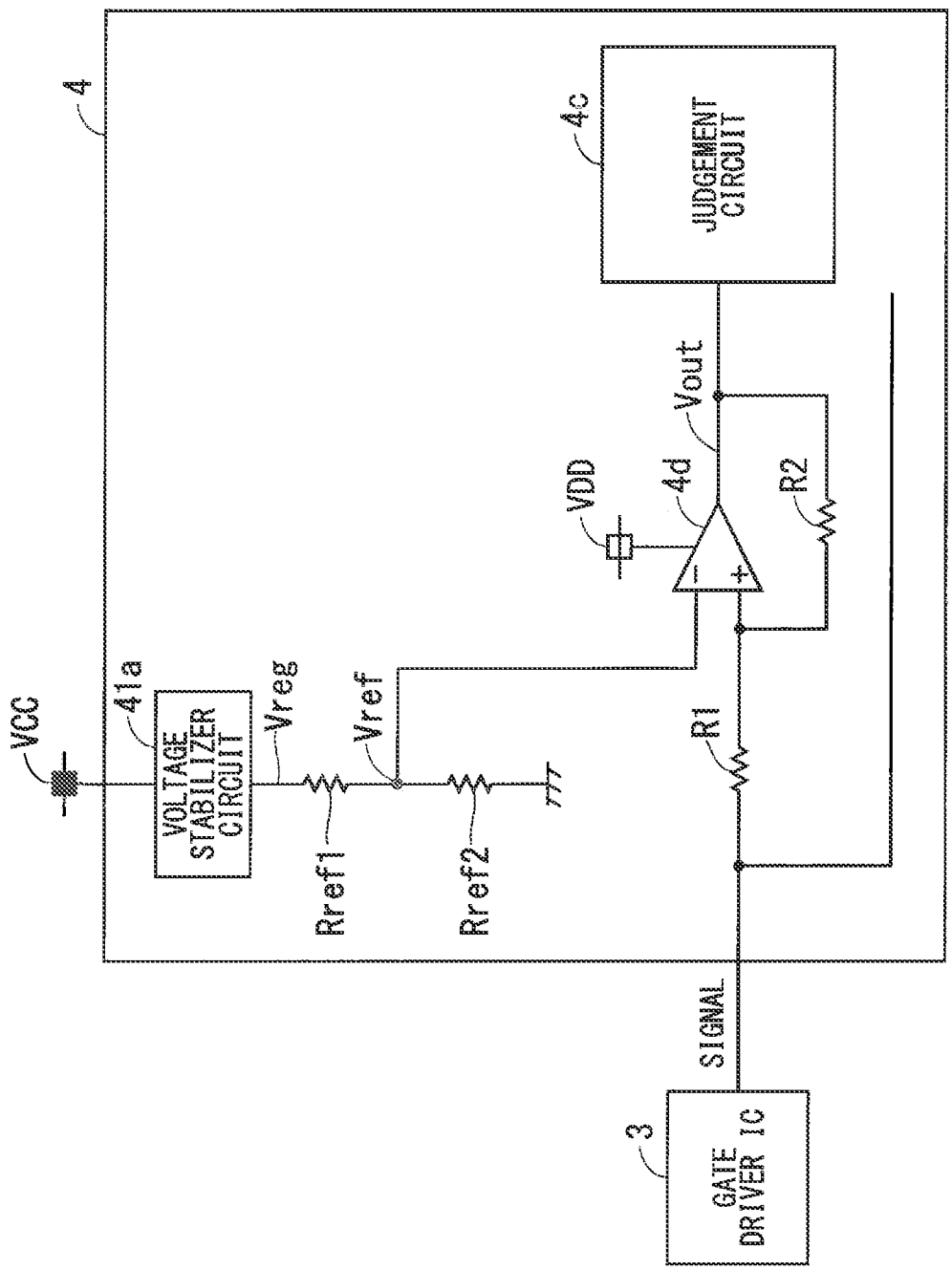
FIG. 18 is a diagram illustrating a configuration enabling easy adjustment of VTH and VTL, in the TCON of the liquid crystal display device according to the fourth embodiment.

However, boosting the voltage and thereby generating power supply higher than the power supply VCC inside the TCON 4 is generally difficult, though it is easy for a TCON 4-embedded driver IC that integrally includes the source driver ICs 2 and the TCON 4. In light of this, for example, as illustrated in FIG. 18, it is preferable to adopt a configuration in which the voltage of the power supply VDD of the third comparator 4d is higher than a voltage (voltage Vreg) of the power supply VCC of the power supply circuit 9 that is adjusted by a voltage stabilizer circuit 41a including a voltage adjustment circuit, or higher than a voltage of the gradation reference voltage generation circuit 10. A configuration of adjusting the power supply of a low voltage that may be generated by a low dropout (LDO) regulator or the like for an internal logic and thereby generating the above voltage Vreg may allow direct use of the power supply VCC, and even the power supply VDD, for the power supply of the third comparator 4d.

For example, applying values of Rref1=25 kΩ, Rref2=100 kΩ, R1=70 kΩ, and R2=100 kΩ to a configuration of Vreg=2 V, VCC=VDD=VH=Vout=3.3 V, and VL=0 V brings VTH to 2.72 V and VTL to 0.41 V. Such application can make the minimum threshold VIH1 higher than the minimum value VIH, and the maximum threshold VIL1 lower than the maximum value VIL.

Figure 19:
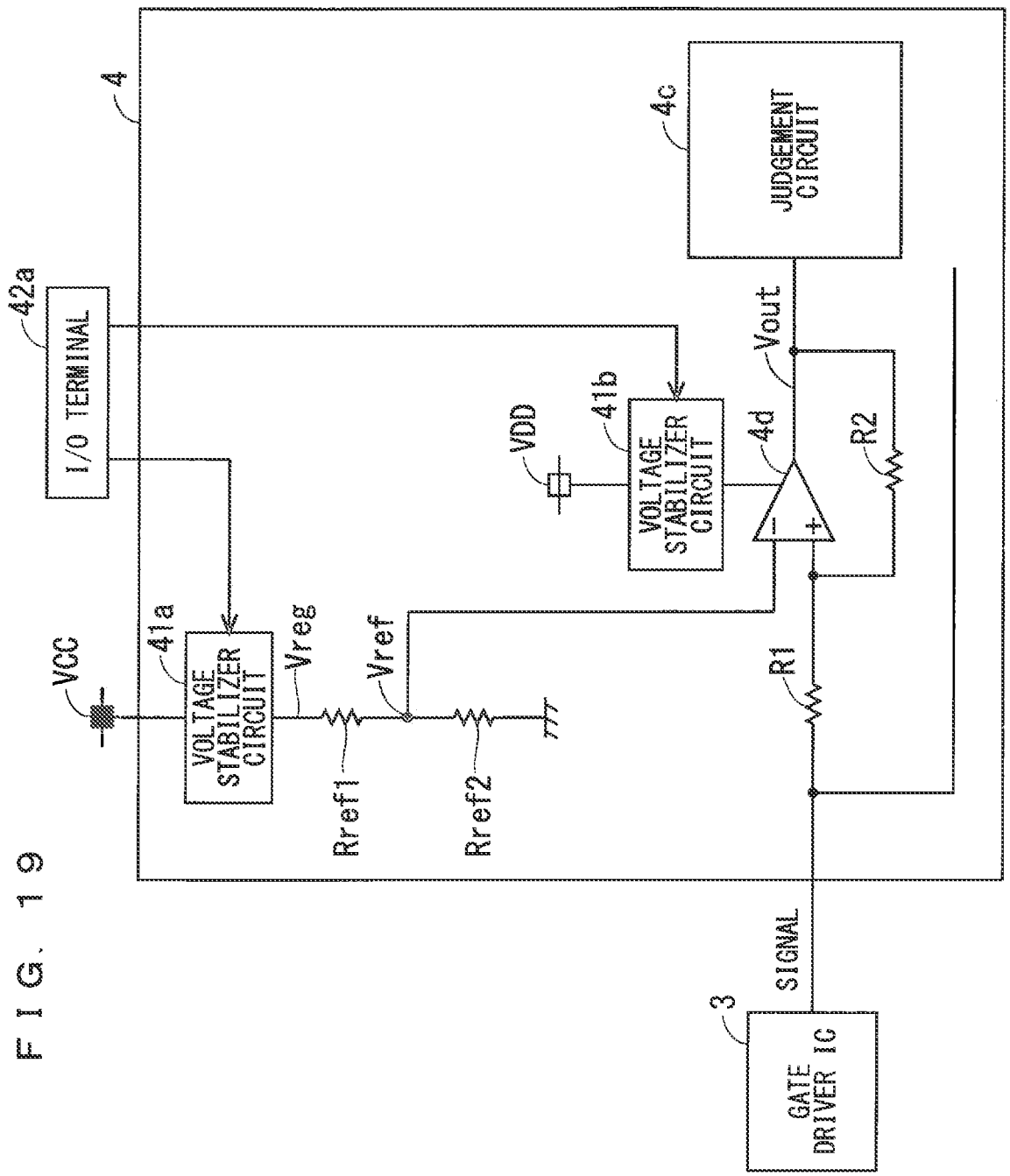
FIG. 19 is a diagram illustrating a configuration enabling easy adjustment of VTH and VTL from the outside of the TCON by using an I/O terminal, in the TCON of the liquid crystal display device according to the fourth embodiment.
Figure 20:
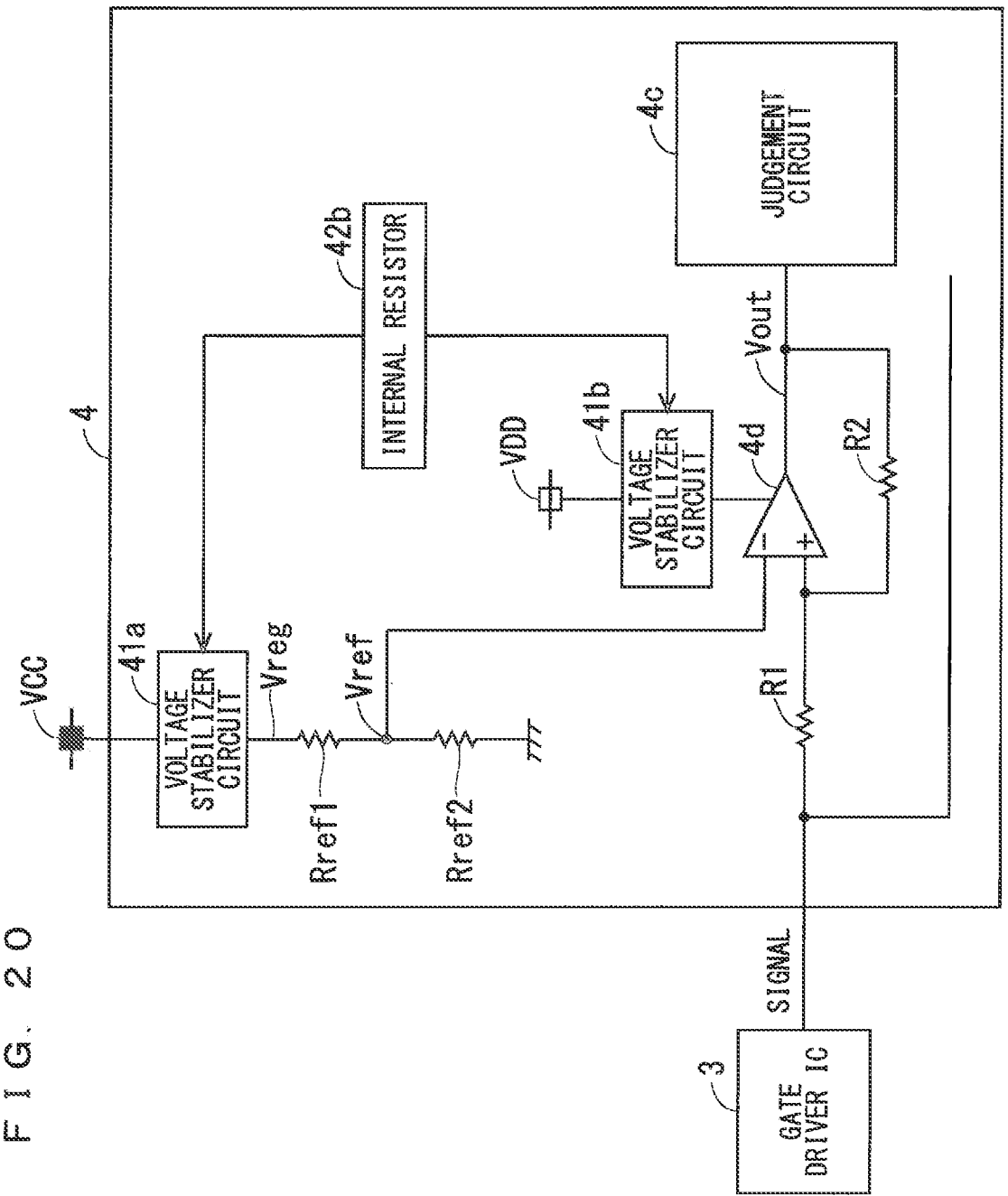
FIG. 20 is a diagram illustrating a configuration enabling easy adjustment of VTH and VTL from the outside of the TCON by using an internal resistor, in the TCON of the liquid crystal display device according to the fourth embodiment.

Note that, for example, as illustrated in FIG. 19, the power supply of the third comparator 4d may be adjusted by a voltage stabilizer circuit 41b including a voltage adjustment circuit. Alternatively, the voltage Vreg and the voltage of the power supply of the third comparator 4d may be adjusted from the outside by connecting an I/O terminal 42a to each of the voltage stabilizer circuits 41a and 41b. Alternatively, for example, as illustrated in FIG. 20, the voltage Vreg and the voltage of the power supply of the third comparator 4d may be adjusted from the outside by connecting an internal resistor 42b to each of the voltage stabilizer circuits 41a and 41b. Such a configuration makes it easier to adjust the minimum threshold VTH and the maximum threshold VTL, and even the minimum threshold VIH1 and the maximum threshold VIL1, for each individual product, and is therefore efficient.

Overview of Fourth Embodiment

The TCON 4 and the liquid crystal display device according to the fourth embodiment can produce effects similar to those of the second embodiment, with the use of one comparator.

Other Modifications

The liquid crystal display device only needs to include at least one of the gate driver IC 3 according to the first embodiment or the third embodiment and the TCON 4 according to the second embodiment or the fourth embodiment. Although the gate driver IC 3 is provided with an abnormal detection function in the first embodiment and the third embodiment, the source driver IC 2 may be provided with an abnormal detection function similar to the abnormal detection function of the gate driver IC 3. Further, the above embodiments may also apply to a TCON-embedded driver IC. Note that, if a TCON-embedded driver IC is employed in the third embodiment, the voltage of the power supply VDD of the third comparator 3g may be set higher than the voltage of the power supply VCC of the power supply circuit 9 for generating a reference voltage of the third comparator 3g, or higher than the voltage of the gradation reference voltage generation circuit 10, as in the fourth embodiment described above.

The first to fourth embodiments described above take an example of determination of disconnection in the power supply line VCC and the ground line GND on the glass substrate 1. However, it goes without saying that the first to fourth embodiments described above are also applicable to determination of disconnection in only one or both of the power supply line VCC and the ground line GND.

Note that, in the present invention, each embodiment and each modification can be freely combined and each embodiment and each modification can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A drive circuit that drives liquid crystals of a liquid crystal display device, the drive circuit being connected to a liquid crystal drive controller with a power supply line and a ground line, the drive circuit comprising:
    a first diode including a cathode connected to the power supply line;
    a second diode including a cathode connected to an anode of the first diode, and including an anode connected to the ground line,
        a predetermined signal being input to a connection point between the first diode and the second diode of the drive circuit, through a line different from the power supply line and the ground line;
    a comparison unit configured to compare a first potential difference between both ends of the first diode and a first threshold, and compare a second potential difference between both ends of the second diode and a second threshold; and
    a judgement circuit configured to determine occurrence of disconnection in at least one of the power supply line and the ground line, based on a comparison result of the comparison unit.

2. The drive circuit according to claim 1, wherein the comparison unit includes
    a first comparator configured to compare the first potential difference with the first threshold, and
    a second comparator configured to compare the second potential difference with the second threshold.

3. The drive circuit according to claim 1, wherein the comparison unit includes a hysteresis comparator being configured to respectively compare the first potential difference and the second potential difference with the first threshold and the second threshold, based on a sum of the first potential difference and the second potential difference, and a voltage at the connection point between the first diode and the second diode.

4. The drive circuit according to claim 3, wherein a voltage of a power supply of the comparison unit is higher than a voltage of a power supply circuit configured to generate a reference voltage of the comparison unit, or higher than a voltage of a voltage generation circuit configured to generate a voltage of the drive circuit.

5. The drive circuit according to claim 3, wherein a voltage of a power supply of the comparison unit is different from a voltage of a power supply of the power supply line.

6. The drive circuit according to claim 3, wherein a voltage of a power supply of the comparison unit is adjustable.

7. The drive circuit according to claim 1, wherein a voltage of a power supply of the comparison unit is different from a voltage of a power supply of the power supply line.

8. The drive circuit according to claim 1, wherein a voltage of a power supply of the comparison unit is adjustable.

* * * * *